(12) United States Patent
Chou

(10) Patent No.: US 6,954,379 B2
(45) Date of Patent: Oct. 11, 2005

(54) POWER-ON RESET CIRCUIT FOR ERASING OF SPLIT GATE FLASH MEMORY REFERENCE CELLS

(75) Inventor: Shao-Yu Chou, Taoyuan (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 185 days.

(21) Appl. No.: 10/755,496

(22) Filed: Jan. 12, 2004

(65) Prior Publication Data

US 2004/0145948 A1 Jul. 29, 2004

Related U.S. Application Data

(63) Continuation of application No. 10/197,049, filed on Jul. 17, 2002, now Pat. No. 6,711,062.

(51) Int. Cl.$^7$ .......................... G11C 16/04; G11C 16/06
(52) U.S. Cl. ............... 365/185.2; 365/185.33; 327/143; 327/198
(58) Field of Search .................. 365/185.2, 185.33; 327/143, 198

(56) References Cited

U.S. PATENT DOCUMENTS

| | | | |
|---|---|---|---|
| 5,675,537 A | 10/1997 | Bill et al. ............... | 365/185.22 |
| 5,801,985 A | 9/1998 | Roohparvar et al. ... | 365/185.01 |
| 5,936,443 A | * 8/1999 | Yasuda et al. ............... | 327/143 |
| 6,073,204 A | 6/2000 | Lakhani et al. ............. | 711/100 |
| 6,122,198 A | 9/2000 | Haddad et al. ......... | 365/185.22 |
| 6,737,884 B2 | * 5/2004 | Shigemasa et al. ........... | 326/38 |

* cited by examiner

Primary Examiner—Son Mai
(74) Attorney, Agent, or Firm—Duane Morris LLP

(57) ABSTRACT

In a standard Flash EPROM, a plurality of flash memory cells are arranged in an array of rows and columns. In order to determine the programming state of each cell, the magnitude of the cell read current is measured using a reference current source set to approximately 25 uA. The memory cell being examined is connected with the drain wired to a positive voltage between about 1 to 2 volts. The source of the memory cell is connected to the current source. The control gate voltage is set to approximately 5V. An unprogrammed memory cell will have a drain current equal to that of the reference current source and the cell output will be slightly less than the drain voltage (logic 1). Under these conditions, a programmed memory cell, having a higher threshold voltage, will conduct only leakage currents. This results in the cell output being very close to ground potential (logic 0). Older technologies utilized fixed current sources for the reference current. In order to better track manufacturing tolerances, more recent technologies use a "reference cell" identical to the standard memory cell to form the reference current source. This reference cell is erased under the same conditions as a memory cell. Since the memory and reference cells are identical in geometry, their current characteristics will track regardless of manufacturing process variations. In order to maintain the proper state for the reference cells, they must be periodically erased. Most manufacturers erase the reference cells during a mass erase resulting in repeated high voltage stress equal to the memory array and decoder. The present invention reduces this high voltage stress using a method where a pulse initiating the erasure of the reference cells is generated upon application of power to the memory.

18 Claims, 2 Drawing Sheets

POWER-ON RESET CIRCUIT FOR ERASING OF SPLIT GATE FLASH MEMORY REFERENCE CELLS

This is continuation application of U.S. patent application Ser. No. 10/197,049 filed on Jul. 17, 2002, now U.S. Pat No. 6,711,062.

BACKGROUND OF THE INVENTION (1) Field of the Invention

The invention generally relates to a method used in semiconductor memory manufacturing and; more particularly, to a method of erasing Memory reference cells in a split gate flash electrically erasable programmable read only memory (EEPROM) in the fabrication of integrated circuits (ICs).

(2) Description of Prior Art

Electrically erasable EEPROMs often referred to as "Flash" EEPROM, have emerged as an important non-volatile memory. Having the same cell density as standard EPROMs, they have the advantage over EPROMs that they need not be exposed to ultraviolet (UV) light to be erased. This is also an advantage in that standard IC packages can be used for these devices whereas standard EPROMs require a special package allowing the IC die to be exposed to UV light.

In a standard Flash EEPROM, a plurality of flash memory cells are arranged in an array of rows and columns. Refer now to FIG. 1 showing a typical flash memory cell device. Each cell 10 is composed of a p-type substrate 12 and separate n-type source 14 and drain 16 regions formed on the substrate 12. A p-type channel region 18 in the substrate 12 separates the source 14 and drain 16. A floating gate 20, electrically isolated from and positioned over the channel region 18, is separated from the substrate 12 by a thin dielectric layer 22. A control gate 24 is separated from the floating gate 20 by a second dielectric layer 26.

To program the flash EEPROM cell, the drain and control gate are raised to voltages above the voltage applied to the source region. For example, the drain voltage ($V_D$) and control gate voltage ($V_{CG}$) are set to 5.5V and 9V above the source voltage, respectively. This produces hot electrons, which are transferred across the thin dielectric layer, trapping them on the floating gate. The control gate voltage threshold is the minimum voltage that must be applied to the control gate in order to affect conduction between the source and drain. This injection of hot electrons has the effect of raising the control gate threshold by about two to four volts.

To erase a flash EEPROM cell, the source voltage ($V_S$) is set to a positive voltage and the control gate voltage ($V_{CG}$) is set to a negative voltage (e.g. 5V and −8V, respectively) while the drain floats. An electric field forms between the source and floating gate thereby removing the negative charge on the floating gate by Fowler-Nordheim tunneling.

In order to determine the programming state of a cell, the magnitude of the cell read current is measured. This is accomplished as shown in FIG. 2. A reference current source 40 set to approximately 25 uA is connected to ground potential. The memory cell 42 being examined is connected with the drain wired to a fixed positive voltage between about 1 to 2 volts, for example. The source of the memory cell 42 is connected to the ungrounded terminal of the current source 40. The control gate voltage ($V_{CG}$) is set to approximately 5V. Under these read conditions, an unprogrammed memory cell 42 (storing a logic 1) will have a drain current equal to that of the reference current source 40 and the output (cell source voltage) will be slightly less than the voltage applied to the drain (logic 1). A programmed memory cell (logic 0), having a higher threshold voltage, will conduct only leakage currents. This results in the output (cell source voltage) being very close to ground potential (logic 0). Older memory technologies compared the memory cell current against a fixed current source. Because the current source circuitry differed from the memory cell circuitry, the current characteristics of the two limited the tolerance for variations in manufacturing process. More recent technologies and the memory circuit of the present invention use a "reference cell" identical to the standard memory cell to form the current source. This reference cell-has been erased under the same conditions as a memory cell. Since the memory and reference cells are identical in geometry, their current characteristics will track regardless of manufacturing process variations. By comparing the memory cell current with the reference cell current, determination of the cell condition is simply achieved as described above.

In order to maintain the proper state for the reference cells, they must be periodically erased. A simple method would require that the user initiate a command to erase the reference cells; however this would require additional external circuitry and complexity to use the memory circuit. Another method would be to erase the reference cells simultaneously with each memory cell erasure. This, however, could cause high voltage overstressing resulting in damage to the decoder circuitry. Most flash EEPROM manufacturers erase the reference cells during a mass erase (when the entire array is erased). This results in high voltage stress equal to (in the case of mass erase) or less than (in the case of page erase) that of the normal memory array.

Other approaches related to improving Flash EEPROMs exist. U.S. Pat. No. 6,122,198 to Haddad et al. teaches a method for guaranteeing that an erased cell threshold voltage in a two bit per cell Flash EEPROM falls within prescribed limits. This is accomplished by testing for both over and under erase conditions until all cells pass satisfactorily. U.S. Pat. No. 5,675,537 to Bill et al. teaches a method where overerasure of memory cells in a Flash EPROM is prevented by halting erasure once a prescribed cell threshold is reached. U.S. Pat. No. 5,801,985 to Roohparvar et al. teaches a method where non-volatile memory is used to set memory system parameters such as threshold, word length, and addressing scheme. U.S. Pat. No. 6,073,204 to Lakhani et al. teaches a method using a single memory controller connected to several memory devices using common bus architecture to optimize memory performance.

SUMMARY OF THE INVENTION

A principal object of the present invention is to provide a method that erases the reference cells in a Flash EEPROM memory.

Another object of the present invention is to provide a method that erases the reference cells in a Flash EEPROM memory upon application of power to the memory device.

Another object of the present invention is to provide a method that erases the reference cells in a Flash EEPROM memory upon application of power to the memory device without requiring the application of external signals.

Another object of the present invention is to provide a method that erases the reference cells in a Flash EEPROM memory upon application of power to the memory device without requiring the application of external signals, thereby reducing the high voltage stress on the reference cell decoder circuitry.

These objects are achieved by using a method where a pulse is generated upon application of power to the Flash EEPROM memory that initiates the erasure of each of the reference cells.

BRIEF DESCRIPTION OF THE DRAWINGS

In the accompanying drawings forming a material part of this description, there is shown.

DESCRIPTION OF THE PREFERRED EMBODIMENTS

Figure 1:
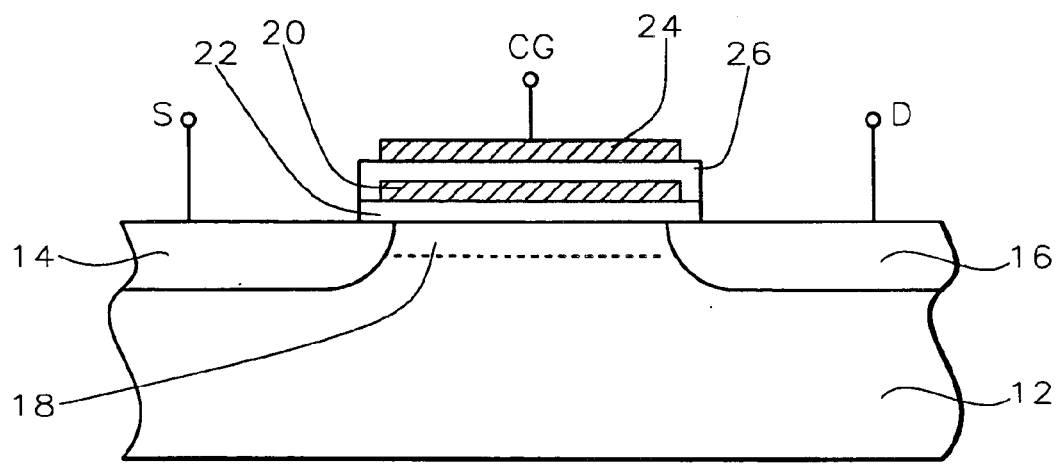
FIG. 1 schematically illustrates in cross-sectional representation a typical Flash EEPROM memory cell.
Figure 2:
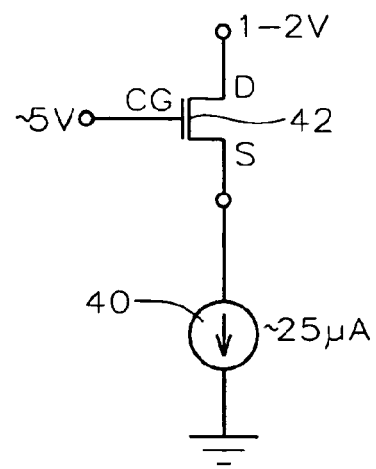
FIG. 2 schematically illustrates the method of determining the memory cell logic state in a typical Flash EEPROM memory.
Figure 3:
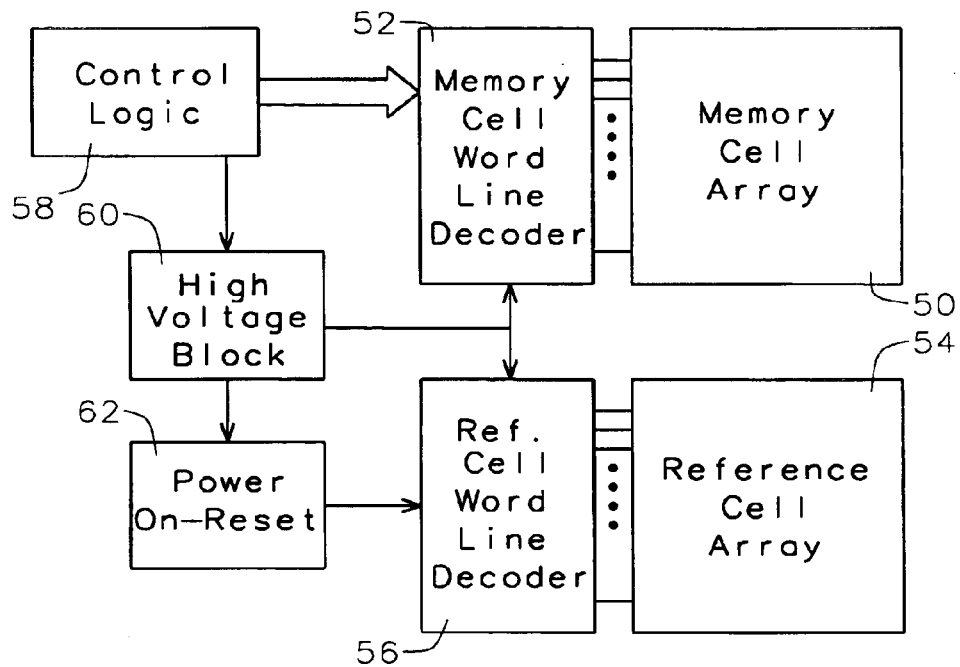
FIG. 3 illustrates a block diagram representation of the method of erasing the reference cells of the present invention.

Refer now to FIG. 3, depicting in block diagram the method of the present invention. A memory cell array 50 is provided with a memory cell word line decoder 52. A reference cell array 54 is also provided with a corresponding reference cell word line decoder 56. A control logic block 58 facilitates programming and reading of data to or from the memory cell array 50. A high voltage circuit block 60 controls the gate voltage applied to either program or erase a memory cell. An important point of the present invention is the power-on-reset (POR) block 62. This provides a momentary pulse that initiates erasure of the reference cells in the reference cell array 54 whenever power is applied to the flash EEPROM. This ensures the proper determination of logic state in the memory cell array and, by minimizing the number of erasures to the reference cells 54, reduces the high voltage stress on the reference cell array 54 and decoder 56. The erasure is performed automatically and requires no additional circuit complexity.

Figure 4:
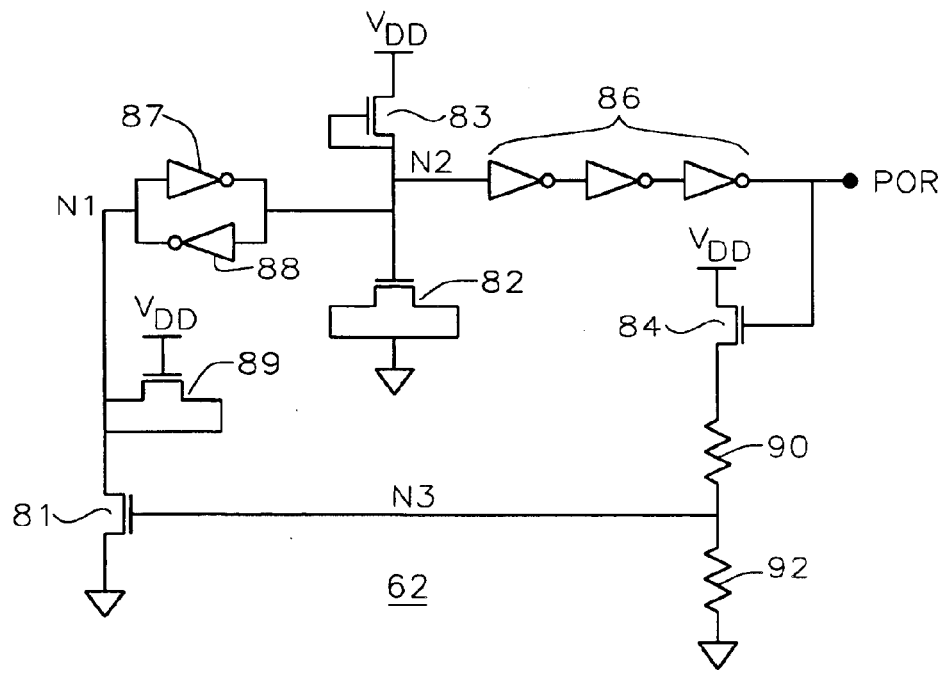
FIG. 4 schematically illustrates one embodiment of the power on reset circuit of the present invention.

Refer now more particularly to FIG. 4, showing one embodiment of the POR circuit 62 of the present invention. When power is applied to the circuit and $V_{DD}$ rises from 0 V, node N2 will initially be held low (logic 0) by MOSFET 82 functioning as a capacitor. MOSFET capacitor 82 charges through MOSFET 83 functioning as a resistor. The rise time of node N2 is a function of MOSFET capacitor 82 and MOSFET resistor 83. Node N2 is applied to an odd plurality of inverters 86 (three inverters are shown). Thus, the output of the circuit, POR, is initially high (logic 1). The output, POR, is applied to the gate of MOSFET 84. When POR is high, MOSFET 84 is on allowing current to flow through resistors 90 and 92. Node N3 will be pulled high, thereby turning MOSFET 81 on and pulling node N1 low. A second MOSFET capacitor 89 is attached to N1, thereby slowing the voltage transitions on N1. Node N1 is applied to the input of inverter 87. The output of inverter 87 is connected to node N2, and to a second inverter 88 that has its output tied back to N1. Thus the two inverters 87 and 88 form a latch circuit that will maintain the voltage on N2 after the initial charging of MOSFET capacitor 82. When N1 is low, the output of inverter 87 will pull N2 high. When N2 voltage reaches a threshold, N1 will be held low through inverter 88 and POR will be driven low through the odd plurality of inverters 86. Once POR is low, MOSFETs 84 and 81 will be off and the latch formed by inverters 87 and 88 will keep nodes N1 and N2 low and high, respectively and keeping POR low. When $V_{DD}$ is removed from the circuit, MOSFET capacitor 82 will be quickly discharged through MOSFET resistor 83. Each time $V_{DD}$ is applied a high POR pulse with duration of between about 0.1 and 10 mS is generated. This pulse is used to initiate the erasure of the reference cells. Since this pulse only occurs when power is applied to the integrated circuit, there is limited high voltage stress on the reference cell array and decoder.

These objects of the present invention are thus achieved using a method where a pulse generated by the power-up reset circuit upon application of power to the flash EEPROM memory initiates the erasure of each of the reference cells. This ensures the proper determination of logic state in the memory cell array and, by minimizing the number of erasures to the reference cells, reduces the high voltage stress on the reference cell array and decoder. Since this erasure is performed automatically, it has the benefit of needing no additional circuit complexity in the application where the flash EEPROM is used.

While the invention has been particularly shown and described with reference to the preferred embodiments thereof, it will be understood by those skilled in the art that various changes in form and details may be made without departing from the spirit and scope of the invention.

What is claimed is:

1. A power-on reset circuit in a flash EPROM memory comprising:
   a first capacitor with one terminal grounded and the other terminal connected to a first node;
   a first resistor with one terminal tied to $V_{DD}$ and the other terminal tied to said first node;
   a plurality of inverters wherein the input of said plurality of said inverters is connected to said first node and the output of said plurality of inverters is connected to the circuit output;
   a latch comprised of a first and second inverter wherein the input of said first inverter and the output of said second inverter are connected to said first node and the input of said second inverter and the output of said first inverter are connected to a second node;
   a second capacitor with one terminal connected to $V_{DD}$ and the other terminal connected to said second node;
   a first MOSFET with the drain terminal connected to said second node, the source terminal connected to ground and the gate terminal connected to a third node;
   a second resistor with one terminal connected to said third node and the other terminal connected to ground;
   a third resistor with one terminal connected to said third node and the other terminal connected to a fourth node; and
   a second MOSFET with the drain terminal connected to $V_{DD}$, the source terminal connected to said fourth node and the gate terminal connected to said circuit output.

2. The circuit according to claim 1 wherein said first capacitor is a MOSFET device.

3. The circuit according to claim 1 wherein said second capacitor is a MOSFET device.

4. The circuit according to claim 1 wherein said first resistor is a MOSFET device.

5. The circuit according to claim 1 wherein erasing of reference cells in said flash EPROM memory is initiated by a pulse generated by said power-on reset circuit upon each application of supply voltage to said flash EPROM.

6. The circuit according to claim 5 wherein said pulse has duration of between about 0.1 and 10 mS.

7. The circuit according to claim 6 wherein said duration of said pulse is determined by the values of one capacitor and one resistor.

8. The circuit according to claim 7 wherein said capacitor is a MOSFET device.

9. The circuit according to claim 7 wherein said resistor is a MOSFET device.

10. A power-on reset circuit in a flash EPROM memory comprising:

a first capacitor with one terminal grounded and the other terminal connected to a first node;

a first resistor with one terminal tied to $V_{DD}$ and the other terminal tied to said first node;

an odd plurality of inverters wherein the input of said odd plurality of said inverters is connected to said first node and the output of said odd plurality of inverters is connected to the power-on reset circuit output;

a latch comprised of a first and second inverter wherein the input of said first inverter and the output of said second inverter are connected to said first node and the input of said second inverter and the output of said first inverter are connected to a second node;

a second capacitor with one terminal connected to $V_{DD}$ and the other terminal connected to said second node;

a first MOSFET with the drain terminal connected to said second node, the source terminal connected to ground and the gate terminal connected to a third node;

a second resistor with one terminal connected to said third node and the other terminal connected to ground;

a third resistor with one terminal connected to said third node and the other terminal connected to a fourth node; and a second MOSFET with the drain terminal connected to $V_{DD}$, the source terminal connected to said fourth node and the gate terminal connected to said power-on reset circuit output.

11. The circuit according to claim 10 wherein said first capacitor is a MOSFET device.

12. The circuit according to claim 10 wherein said second capacitor is a MOSFET device.

13. The circuit according to claim 10 wherein said first resistor is a MOSFET device.

14. The circuit according to claim 10 wherein erasing of reference cells in said flash EPROM memory is initiated by a pulse generated by said power-on reset circuit upon each application of supply voltage to said flash EPROM.

15. The circuit according to claim 14 wherein said pulse has duration of between about 0.1 and 10 mS.

16. The circuit according to claim 14 wherein said duration of said pulse is determined by the values of one capacitor and one resistor.

17. The circuit according to claim 14 wherein said capacitor is a MOSFET device.

18. The circuit according to claim 14 wherein said resistor is a MOSFET device.

* * * * *